United States Patent
Shizawa et al.

(10) Patent No.: US 9,590,827 B2
(45) Date of Patent: Mar. 7, 2017

(54) DISTORTION COMPENSATION APPARATUS, WIRELESS COMMUNICATION SYSTEM, AND DISTORTION COMPENSATION METHOD

(71) Applicant: FUJITSU LIMITED, Kawasaki-shi, Kanagawa (JP)

(72) Inventors: Yoshinobu Shizawa, Yokohama (JP); Hiroaki Maeda, Yokohama (JP); Junya Morita, Yokohama (JP); Hiroyuki Ogawa, Yokosuka (JP); Yousuke Okazaki, Kawasaki (JP); Satoshi Matsubara, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/533,682

(22) Filed: Nov. 5, 2014

(65) Prior Publication Data
US 2015/0124904 A1     May 7, 2015

(30) Foreign Application Priority Data

Nov. 7, 2013   (JP) .................................. 2013-231561

(51) Int. Cl.
*H04L 25/08*   (2006.01)
*H03F 1/32*    (2006.01)
(Continued)

(52) U.S. Cl.
CPC ........... *H04L 25/08* (2013.01); *H03F 1/3247* (2013.01); *H03F 1/3282* (2013.01); *H03F 3/189* (2013.01);
(Continued)

(58) Field of Classification Search
CPC ................ H03F 1/3247; H03F 1/3258; H03F 2201/3233; H03F 1/3241; H03F 2200/198;
(Continued)

(56) References Cited

U.S. PATENT DOCUMENTS 6,389,068 B1 *  5/2002  Smith et al. .................. 375/225
7,492,816 B1 *  2/2009  Wong et al. .................. 375/232
(Continued)

FOREIGN PATENT DOCUMENTS

JP     2012-10122 A    1/2012
JP     2012-249022 A   12/2012
JP     2013-77980 A    4/2013

*Primary Examiner* — Janice Tieu
(74) *Attorney, Agent, or Firm* — Arent Fox LLP

(57) ABSTRACT

A distortion compensation apparatus including: an amplifier configured to amplify an input signal including a transmission signal and an impulse signal, the transmission signal being converted to a radio frequency signal for transmission, the impulse signal being not converted to a radio signal for transmission, a memory configured to store a plurality of distortion compensation coefficients for compensating distortion to the input signal, each of the plurality of distortion compensation coefficients being associated with an amplitude of the input signal, and a processor configured to select a distortion compensation coefficient from the plurality of distortion compensation coefficients based on an amplitude of the impulse signal included in the input signal, and update the selected distortion compensation coefficient based on the amplified impulse signal include in the amplified input signal.

15 Claims, 9 Drawing Sheets

(51) Int. Cl.
  *H03F 3/189* (2006.01)
  *H03F 3/24* (2006.01)
(52) U.S. Cl.
  CPC ......... *H03F 3/24* (2013.01); *H03F 2200/321* (2013.01); *H03F 2200/336* (2013.01); *H03F 2200/451* (2013.01); *H03F 2201/3212* (2013.01); *H03F 2201/3233* (2013.01)
(58) Field of Classification Search
  CPC ..... H03F 2201/3224; H03F 2201/3227; H04B 2001/0425; H04B 1/0475; H04B 2001/0433; H04B 2001/0416; H04B 1/04; H04L 27/368
  USPC .......................................... 375/297, 285, 260
  See application file for complete search history.

(56) References Cited

U.S. PATENT DOCUMENTS

| | | | |
|---|---|---|---|
| 2006/0062324 A1* | 3/2006 | Naito et al. ................. | 375/296 |
| 2009/0128123 A1* | 5/2009 | Stein ...................... | G01R 35/00 |
| | | | 324/76.19 |
| 2011/0222630 A1* | 9/2011 | Suzuki ................. | H03F 1/3247 |
| | | | 375/297 |
| 2012/0299648 A1 | 11/2012 | Honda et al. | |

\* cited by examiner

DISTORTION COMPENSATION APPARATUS, WIRELESS COMMUNICATION SYSTEM, AND DISTORTION COMPENSATION METHOD

CROSS-REFERENCE TO RELATED APPLICATION

This application is based upon and claims the benefit of priority of the prior Japanese Patent Application No. 2013-231561, filed on Nov. 7, 2013, the entire contents of which are incorporated herein by reference.

FIELD

The embodiments discussed herein are related to distortion compensation apparatus, wireless communication system, and distortion compensation method.

BACKGROUND

Conventionally, an amplifier is used in a wireless communication device. It is generally known that the efficiency of an amplifier is highest in an output saturation state (that is, in a non-linear state). In a non-linear state, a distortion tends to occur in an output signal of an amplifier, and the distortion might cause deterioration of a transmission performance. Thus, there are cases where, in order to increase both of the transmission performance and efficiency of the amplifier, a distortion compensation unit that compensates for a "distortion" originated from a power amplifier is provided in a wireless communication device. Note that, when amplifiers having about the same saturation power are compared, a "distortion" tends to occur when the power of an input signal to an amplifier, that is, the amplitude of a transmission signal, is large.

The distortion compensation unit compares, for example, a transmission signal that has been converted into two series, that is, an I signal and a Q signal by an S/P converter and a signal obtained by feeding back a part of a signal that has been converted into an I signal and a Q signal and then has been subjected to amplification processing to each other, and computes a distortion compensation coefficient such that a difference between the signals is zero. Then, the distortion compensation unit performs distortion compensation by multiplying the transmission signal that has been converted into an I signal and a Q signal by the distortion compensation coefficient. The distortion compensation unit compares the transmission signal before distortion compensation and a signal obtained by feeding back a part of a signal that has been amplified after the distortion compensation to each other, and updates the distortion compensation coefficient as desired. That is, in a predistortion method, which is a distortion compensation method, a characteristic that is inverse to a distortion characteristic of an amplifier is added to an input signal to the amplifier in advance. Thus, in an output of the amplifier, a signal with less distortion is obtained.

In recent years, in a wireless communication device, a gallium nitride (GaN) device, which is an amplifier with high output power and high power efficiency, may be used.

Japanese Laid-open Patent Publication No. 2012-249022 discusses the related art.

SUMMARY

According to an aspect of the invention, a distortion compensation apparatus includes an amplifier configured to amplify an input signal including a transmission signal and an impulse signal, the transmission signal being converted to a radio frequency signal for transmission, the impulse signal being not converted to a radio signal for transmission, a memory configured to store a plurality of distortion compensation coefficients for compensating distortion to the input signal, each of the plurality of distortion compensation coefficients being associated with an amplitude of the input signal, and a processor configured to select a distortion compensation coefficient from the plurality of distortion compensation coefficients based on an amplitude of the impulse signal included in the input signal, and update the selected distortion compensation coefficient based on the amplified impulse signal include in the amplified input signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
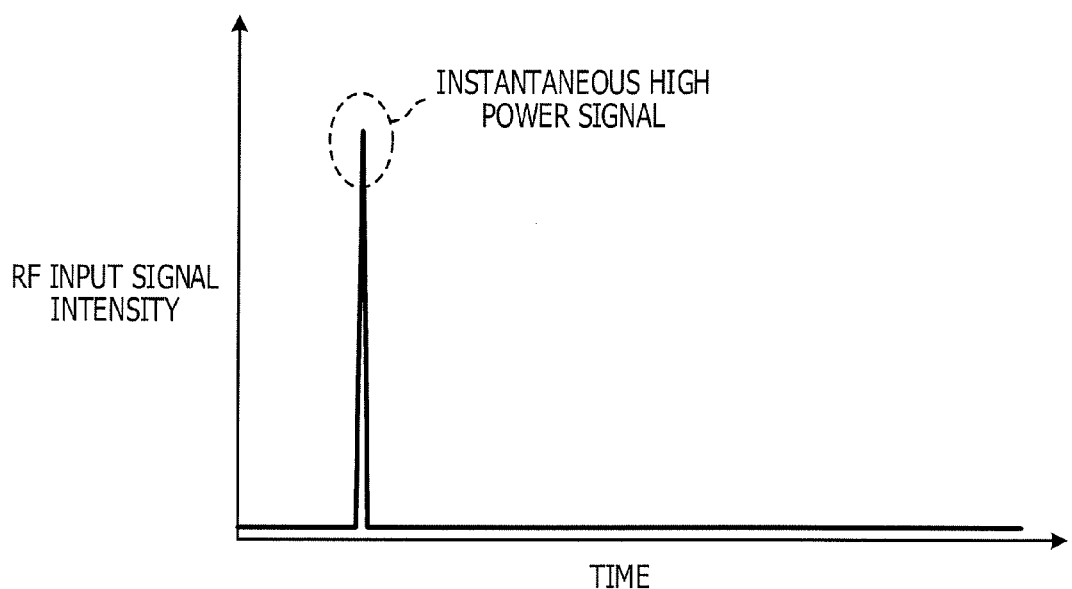
FIG. 1 is a diagram illustrating an exemplary RF input signal.
Figure 2:
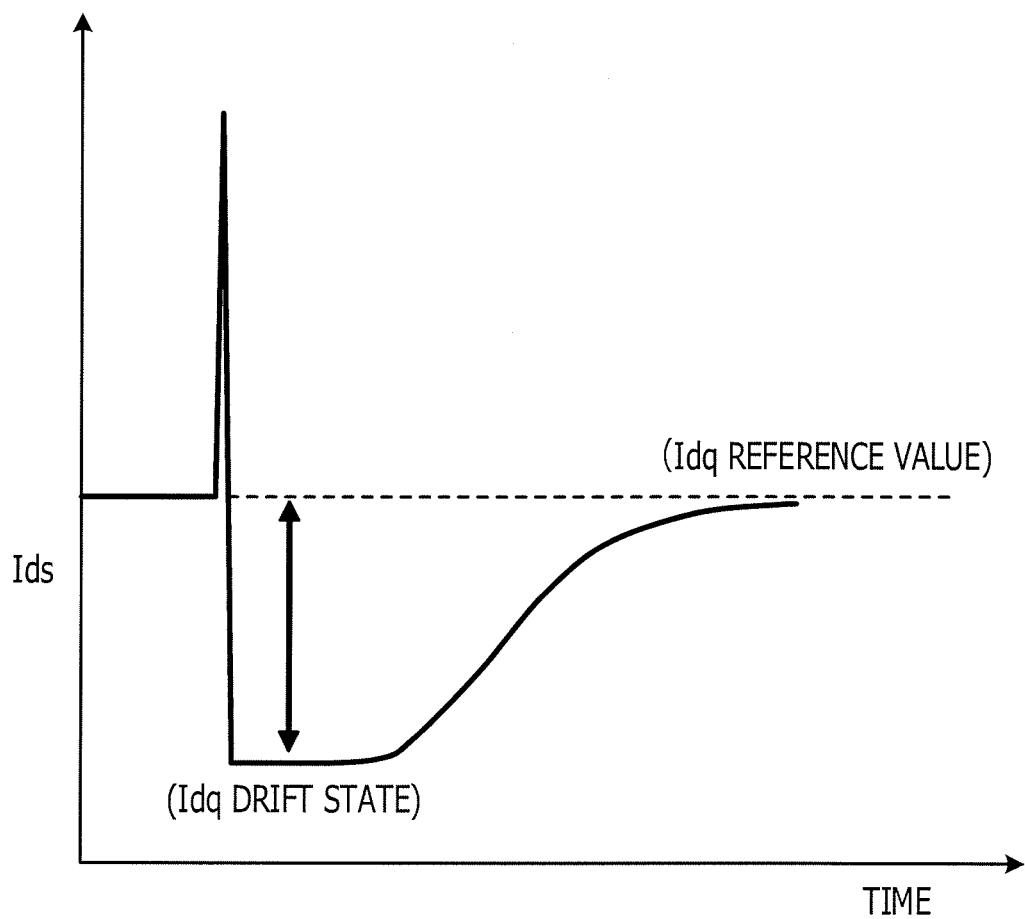
FIG. 2 is a diagram illustrating an exemplary Idq drift when the RF input signal of FIG. 1 is input.

In an amplifier, there are cases where a transient response of a drain bias current (Ids), that is, a phenomenon called "Idq drift" occurs (see FIG. 1 and FIG. 2). An idling current (Idq) is a drain current in an idling state (that is, a state where there is not an RF signal input to an amplifier). When this Idq drift occurs, the input/output characteristic of the amplifier changes, and therefore, a distortion tends to occur. Also, there is a probability that, when a large Idq drift occurs, the distortion increases and a time to be used for causing a distortion compensation coefficient to approximate an optimal value is prolonged. Specifically, when a signal with large power is input, the Idq drift is large, and therefore, the time to be used for causing the distortion compensation coefficient to approximate the optimal value is further prolonged. Also, as described above, when the amplitude of an input signal to the amplifier is large, regardless of the Idq drift, a "distortion" tends to occur. Note that FIG. 1 is a diagram illustrating an exemplary RF input signal, and FIG. 2 is a diagram illustrating an exemplary Idq drift when the RF input signal of FIG. 1 is input.

Therefore, it is important to optimize the distortion compensation coefficient corresponding to large power. When a signal with large power is input, deterioration of a distortion characteristic might increase, the time to be used for causing the distortion compensation coefficient to approximate the optimal value might be prolonged, and accuracy in correction of the distortion compensation coefficient might be deteriorated.

In view of the foregoing, a technique disclosed herein has been devised and it is therefore an object of the present disclosure to provide a wireless device and a wireless access system which enable improvement of accuracy in correction of a distortion compensation coefficient.

Embodiments of a distortion compensation apparatus (may be wireless device or wireless communication apparatus) and a wireless communication system (wireless access system) according to the present disclosure are described below with reference to the accompanying drawings. Note that a wireless device and a wireless access system according to the present disclosure are not limited to the following embodiments. Those parts which have substantially the same function in the following embodiments are designated by the same reference numerals, and duplicate descriptions thereof are omitted.

Embodiment 1

Exemplary Configuration of Wireless Device

Figure 3:
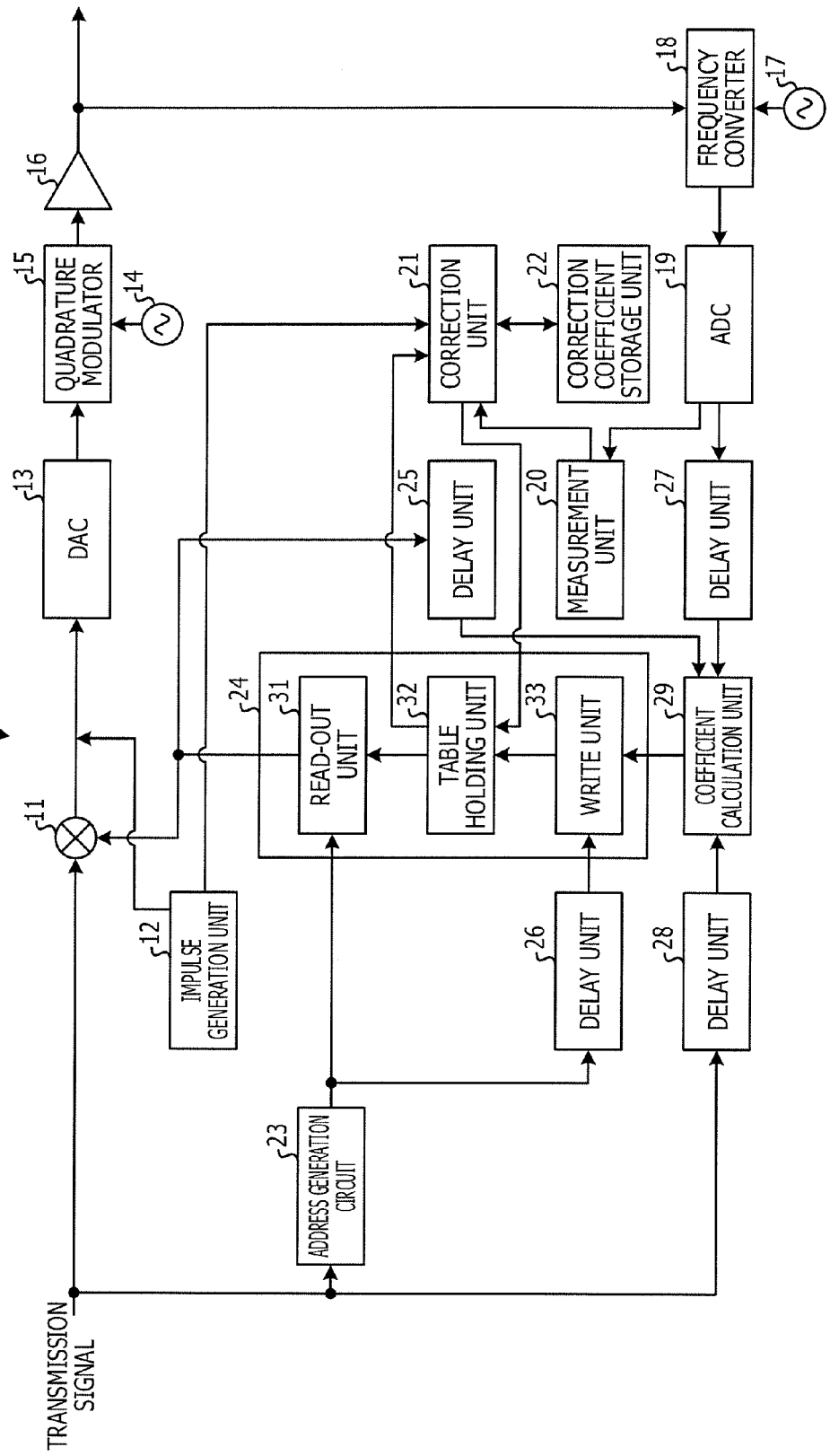
FIG. 3 is a block diagram illustrating an exemplary wireless device according to Embodiment 1.

FIG. 3 is a block diagram illustrating an exemplary wireless device according to Embodiment 1. In FIG. 3, a wireless device 10 includes a multiplier 11, an impulse generation unit 12, a digital-to-analog converter (DAC) 13, local oscillators 14 and 17, a quadrature modulator 15, an amplifier 16, a frequency converter 18, and an analog-to-digital converter (ADC) 19. The wireless device 10 further includes a measurement unit 20, a correction unit 21, and a correction coefficient storage unit 22. The wireless device 10 further includes an address generation circuit 23, a look-up table (LUT) 24, delay units 25, 26, 27, and 28, and a coefficient calculation unit 29.

The multiplier 11 receives a transmission signal in a period (which may be hereinafter referred to as a "transmission period") in which a transmission signal is transmitted. The transmission signal received by the multiplier 11 is a digital baseband signal including, for example, an in-phase component signal (an I signal) and a quadrature component signal (a Q signal). The transmission signal is converted to a radio signal for transmission. The multiplier 11 performs distortion compensation by multiplying the received transmission signal and a distortion compensation coefficient received from the LUT 24, and outputs a signal having an inverse characteristic that cancels a distortion characteristic of the amplifier 16 to the DAC 13. That is, the multiplier 11 functions as a distortion compensation unit.

The impulse generation unit 12 generates, in a "first LUT correction period", an impulse and outputs the generated impulse to the DAC 13. The generated impulse is not a signal intended to be transmitted, that is, is not a transmission signal. Namely, the generated impulse signal is not converted to a radio signal for transmission. Also, the generated impulse has an amplitude equal to or larger than a "predetermined value". The "predetermined value" is preferably larger than average power of a transmission signal. More preferably, when candidates for the transmission signal power are divided into groups of a "low level", a "middle level", and a "high level", the "predetermined value" is a value corresponding to power of the "high level". That is, the "predetermined value" is preferably within a certain range from maximum transmission power. In this case, the "first LUT correction period" is a period in which a "distortion compensation coefficient table" held in the LUT 24 is corrected based on an impulse. Note that the distortion compensation coefficient table is corrected also in the above-described transmission period, and therefore, the above-described transmission period is a "second LUT correction period". The first LUT correction period and the second LUT correction period may at least partially overlap each other, or may not overlap each other at all. In the description of Embodiment 1, it is assumed that the first LUT compensation period and the second LUT compensation period do not overlap at all, that is, the first LUT compensation period is a non-transmission period. The impulse generation unit 12 may generate an impulse using a frequency other than a "desired frequency". The "desired frequency" is a frequency that passes through a filter (not illustrated) provided in an output stage of the amplifier 16. Therefore, a frequency other than the "desired frequency" is a frequency that is removed by the filter.

The impulse generation unit 12 outputs information regarding the above-described "predetermined value" to the correction unit 21 in the "first LUT correction period".

The DAC 13 converts, in the transmission period, a signal having an inverse characteristic that cancels the distortion characteristic of the amplifier 16, which is received from the multiplier 11, to an analog baseband signal.

The DAC 13 converts, in the first LUT correction period, an impulse received from the impulse generation unit 12 to an analog signal (which may be hereinafter referred to as an "impulse analog signal").

The quadrature modulator 15 performs quadrature modulation on the analog baseband signal output from the DAC 13 by using a local oscillation signal received from the local oscillator 14. The quadrature modulator 15 performs quadrature modulation, for example, by respectively multiplying the local oscillation signal received from the local oscillator 14 and a signal obtained by shifting the local oscillation signal by 90 degrees by the I signal and the Q signal output from the DAC 13 and adding the obtained multiplication results.

The quadrature modulator 15 performs, in the first LUT correction period, quadrature modulation on the impulse analog signal received from the DAC 13 by using the local oscillation signal received from the local oscillator 14.

The amplifier 16 amplifies, in the transmission period, the transmission signal output from the quadrature modulator 15 and emits the amplified transmission signal in the air via an antenna. Note that, in the transmission period, some of signals output from the quadrature modulator 15 are input to a feedback path, that is, the frequency converter 18. Note that hereinafter a signal that is based on a transmission signal and fed back to the feedback path may be merely referred to as a "feedback signal".

The amplifier 16 amplifies, in the first LUT correction period, a signal obtained from the impulse analog signal in the quadrature modulator 15 and outputs the amplified signal to the feedback path. Note that hereinafter a signal that is based on an impulse signal and fed back to the feedback path may be referred to as an "impulse feedback signal".

The frequency converter 18 performs frequency conversion of the feedback signal in the transmission period. The frequency converter 18 generates an I signal and a Q signal of baseband signals at the transmission side, for example, by multiplying each feedback signal by a local oscillation signal generated by the local oscillator 17 and a signal obtained by shifting the local oscillation signal by 90 degrees and performing quadrature detection.

In addition, the frequency converter 18 performs frequency conversion of the impulse feedback signal in the first LUT correction period. Thus, an impulse analog signal on which the Idq drift characteristic of the amplifier 16 is reflected is obtained.

The local oscillator 17 generates a local oscillation signal having the same frequency as that of the local oscillation signal output from the local oscillator 14 and outputs the generated local oscillation signal to the frequency converter 18. The local oscillator 17 and the local oscillator 14 may be realized by a single local oscillator.

The ADC 19 converts, in the transmission period, the feedback signal which has been frequency-converted by the frequency converter 18 to a digital signal and outputs the digital signal to the coefficient calculation unit 29 via the delay unit 27.

The ADC 19 converts, in the first LUT correction period, the impulse feedback signal which has been frequency-converted by the frequency converter 18 to a digital signal and outputs the digital signal to the measurement unit 20.

The measurement unit 20 measures, in the first LUT correction period, a drain bias current characteristic, that is, an amplitude fluctuation and a phase fluctuation caused by the influence of the above-described Idq drift, when the impulse generated by the impulse generation unit 12 is input to the amplifier 16 via the DAC 13 and the quadrature modulator 15. The measurement unit 20 measures, in the first LUT correction period, an amplitude fluctuation pattern and a phase fluctuation pattern based on a signal received from the ADC 19. For example, the measurement unit 20 measures an amplitude fluctuation pattern or both of the amplitude fluctuation pattern and a phase fluctuation pattern.

Figure 4:
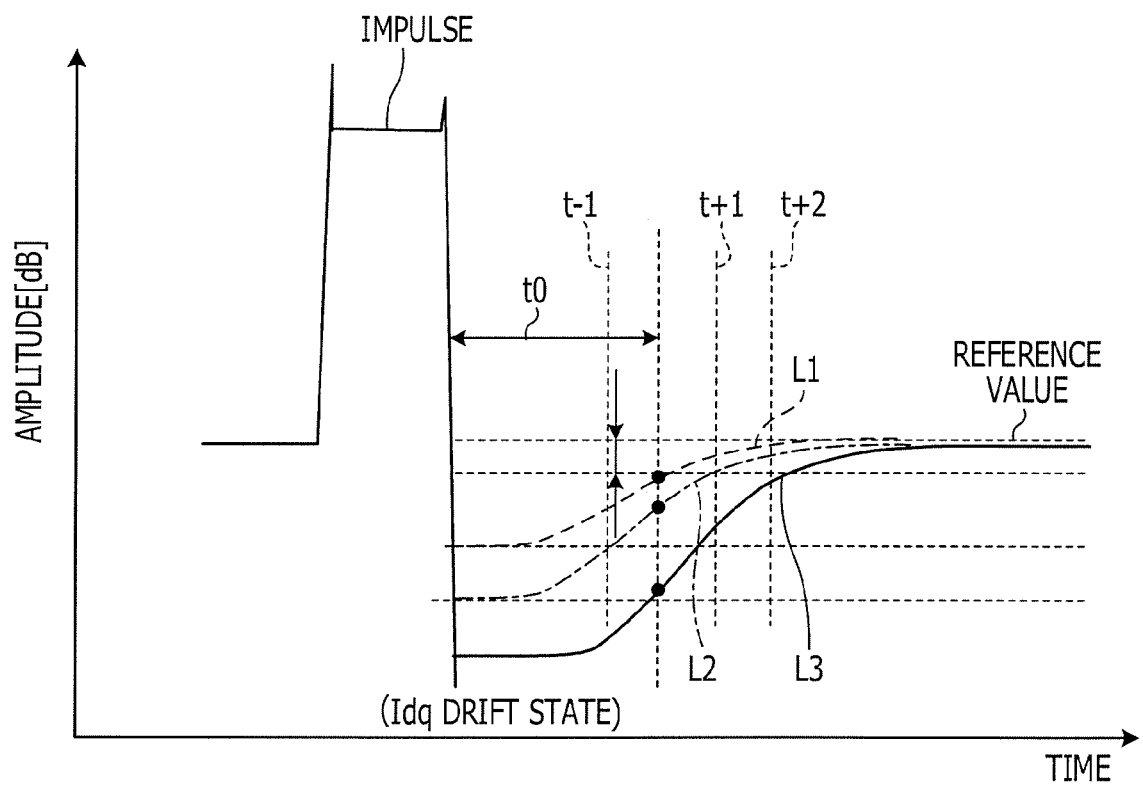
FIG. 4 is a diagram illustrating an amplitude fluctuation pattern.
Figure 5:
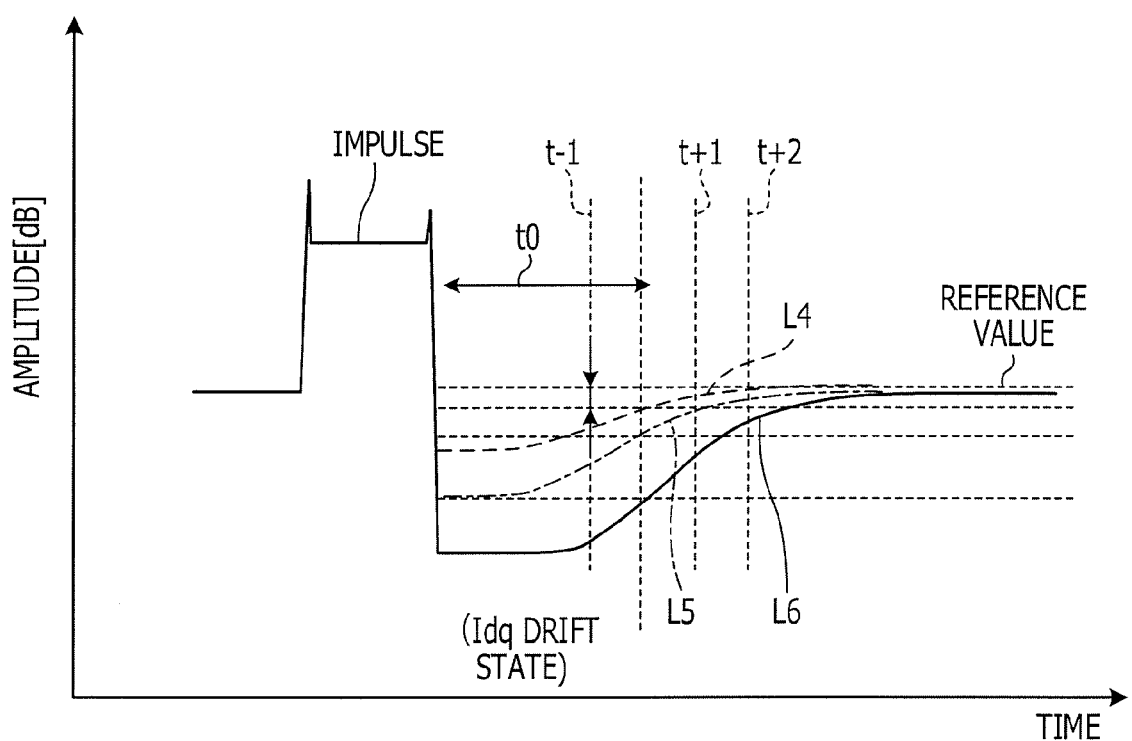
FIG. 5 is a diagram illustrating a phase fluctuation pattern.

FIG. 4 is a diagram illustrating an amplitude fluctuation pattern. FIG. 5 is a diagram illustrating a phase fluctuation pattern.

As illustrated in FIG. 4, after a part corresponding to the impulse appears, the value of amplitude of a signal input to the measurement unit 20 in the first LUT correction period lowers to a level lower than a reference value, and then, changes to approximate the reference value. FIG. 4 illustrates three fluctuation loci corresponding to curved lines L1, L2, and L3. The measurement unit 20 measures such a fluctuation locus and specifies an amplitude fluctuation pattern corresponding to the measured fluctuation locus. For example, the measurement unit 20 measures a deviation range between the reference value and an amplitude value after a predetermined time t0 has elapsed since a time when the part corresponding to the impulse appeared. The measurement unit 20 stores the correspondence relationship between each of a plurality of deviation range candidates and an amplitude fluctuation pattern corresponding to the deviation range candidate. Then, the measurement unit 20 specifies an amplitude fluctuation pattern corresponding to the measured deviation range in the above-described correspondence relationship.

As illustrated in FIG. 5, after a part corresponding to the impulse appears, the value of phase of a signal input to the measurement unit 20 in the first LUT correction period lowers to a level lower than a reference value, and then, changes to approximate the reference value. FIG. 5 illustrates three fluctuation loci corresponding to curved lines L4, L5, and L6. The measurement unit 20 measures such a fluctuation locus and specifies a phase fluctuation pattern corresponding to the measured fluctuation locus. For example, the measurement unit 20 measures a deviation range between the reference value and a phase value after a predetermined time t0 has elapsed since a time when the part corresponding to the impulse appeared. The measurement unit 20 stores the correspondence relationship between each of a plurality of deviation range candidates and a phase fluctuation pattern corresponding to the deviation range candidate. Then, the measurement unit 20 specifies a phase fluctuation pattern corresponding to the measured deviation range in the above-described correspondence relationship.

Then, the measurement unit 20 outputs, to the correction unit 21, information regarding an amplitude fluctuation pattern or regarding both of the amplitude fluctuation pattern and a phase fluctuation pattern. Note that, for the sake of simplicity, in the following description, it is assumed that only an amplitude fluctuation pattern is output to the correction unit 21.

The correction unit 21 reads out, in the first LUT correction period, a correction coefficient $\alpha$ corresponding to the amplitude fluctuation pattern measured by the measurement unit 20 from the correction coefficient storage unit 22. Also, the correction unit 21 reads out a distortion compensation coefficient associated, in a distortion compensation coefficient table (that is, LUT), with an address corresponding to the "predetermined value" received from the impulse generation unit 12, and corrects the read-out distortion compensation coefficient, based on the read-out correction coefficient $\alpha$. Then, the correction unit 21 corrects (updates) the distortion compensation coefficient table with the distortion compensation coefficient after correction. That is, the correction unit 21 corrects (updates) the distortion compensation coefficient associated, in the distortion compensation coefficient table, with the address corresponding to the "predetermined value" received from the impulse generation unit 12 with the distortion compensation coefficient after correction. In this case, it is more advantageous to measure an amplitude fluctuation pattern and a phase fluctuation pattern than to directly measure an Idq drift characteristic in the following points. Deterioration of the distortion characteristic is influenced by both of an amplitude characteristic change and a phase characteristic change, and an appropriate distortion compensation effect is not achieved only by, for example, correcting the Idq drift characteristic. In contrast, in this case, an amplitude fluctuation pattern and a phase fluctuation pattern are measured and the distortion compensation coefficient table is corrected based on the result of the measurement, so that accuracy in compensation is possibly increased, and furthermore, a time to be used for optimizing the distortion compensation characteristic is possibly shortened.

The correction coefficient storage unit 22 stores a correction coefficient correspondence table in which each of a plurality of amplitude fluctuation pattern candidates and a correction coefficient $\alpha$ corresponding to the amplitude fluctuation pattern candidate are associated with each other.

When a transmission signal x(t) is input in the transmission period, the address generation circuit 23 computes power p of the transmission signal x(t), and generates a one-dimensional direction address, that is, for example, an X axis direction address, which uniquely corresponds to the computed power p of the transmission signal x(t). Simultaneously, the address generation circuit 23 obtains a difference $\Delta P$ from power p1 of a transmission signal x(t−1) at the previous time point (t−1), which is stored in the address generation circuit 23, and generates an another-dimensional direction address, that is, for example, a Y axis direction address, which uniquely corresponds to the difference ΔP. The generated address value is output to the LUT 24 and the delay unit 26.

The LUT 24 includes a read-out unit 31, a table holding unit 32, and a write unit 33.

In the transmission period, the read-out unit 31 reads out, from the distortion compensation coefficient table held in the table holding unit 32, a distortion compensation coefficient corresponding to an address value that is received from the address generation circuit 23, and outputs the distortion compensation coefficient to the multiplier 11.

The table holding unit 32 holds the distortion compensation coefficient table. That is, the table holding unit 32 stores a distortion compensation coefficient to be used for cancelling a distortion of the amplifier 16 in a two-dimensional address position corresponding to each discrete power of the transmission signal x(t).

The write unit 33 receives, as input signals, the address generated by the address generation circuit 23 and the distortion compensation coefficient calculated by the coefficient calculation unit 29 in the transmission period. Then, the write unit 33 writes the distortion compensation coefficient calculated by the coefficient calculation unit 29 to the address generated by the address generation circuit 23, thereby updating the distortion compensation coefficient table. Note that a read-out address (AR) which has been generated by the address generation circuit 23 and a write address (AW) are the same address but, because a computation time and the like are spent to obtain an update value, the read-out address is delayed by the delay unit 26 and thus is used as a write address.

In the transmission period, the coefficient calculation unit 29 receives, as input signals, the transmission signal x(t), a feedback demodulation signal y(t) (a feedback signal), and the distortion compensation coefficient output from the read-out unit 31. In this case, the delay units 27 and 28 are provided so that signals input to the coefficient calculation unit 29 are signals obtained from the same transmission signal x(t). That is, a delay time D set in the delay units 25 and 28 is determined so as to satisfy the relationship D=D0+D1, where for example, D0 is a delay time in the DAC 13, the quadrature modulator 15, and the amplifier 16 and D1 is a delay time in the frequency converter 18, the ADC 19, and the delay unit 27.

Figure 6:
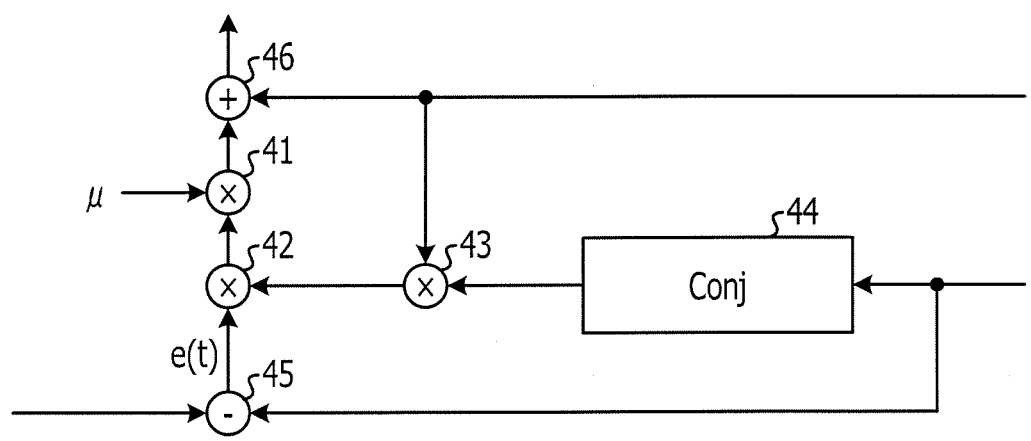
FIG. 6 is a diagram illustrating an exemplary coefficient calculation unit according to Embodiment 1.

For example, the coefficient calculation unit 29 has a configuration illustrated in FIG. 6. FIG. 6 is a diagram illustrating an exemplary coefficient calculation unit according to Embodiment 1. In FIG. 6, the coefficient calculation unit 29 includes multiplication units 41, 42, and 43, a complex conjugate signal output unit (Conj) 44, a subtract unit 45, and an addition unit 46.

The subtraction unit 45 outputs a difference e(t) between the transmission signal x(t) that has been delayed by the delay unit 28 and the feedback demodulation signal y(t) (the feedback signal).

The multiplication unit 43 performs multiplication of a distortion compensation coefficient $h_{n-1}(p)$ and y*(t), and obtains an output u*(t) $(=h_{n-1}(p)y^*(t))$. The multiplication unit 42 performs multiplication of a difference output e(t) of the subtraction unit 45 and the output u*(t). The multiplication unit 41 multiplies a step size parameter μ and an output of the multiplication unit 42 together.

Next, the addition unit 46 adds the distortion compensation coefficient $h_{n-1}(p)$ and an output μe(t)u*(t) of the multiplication unit 41 together, and outputs the result of the addition to the write unit 33.

By the above-described configurations, the following computations are performed.

$$h_n(p)=h_{n-1}(p)+\mu e(t)u^*(t)$$

$$e(t)=x(t)-y(t)$$

$$y(t)=h_{n-1}(p)\times(t)f(p)$$

$$u^*(t)=x(t)f(p)=h_{n-1}(p)y^*(t)$$

$$p=|x(t)|^2$$

In the above-described computations, x, y, f, h, u, and e are complex numbers and * is a complex conjugate number. By performing the above-described computation processing, the distortion compensation coefficient h(p) is updated such that the difference signal e(t) of the transmission signal x(t) and the feedback demodulation signal y(t) is minimum, the distortion compensation coefficient h(p) finally converges to an optimal distortion compensation coefficient value, and the distortion of the amplifier 16 is compensated for.

Exemplary Operation of Wireless Device

Figure 7:
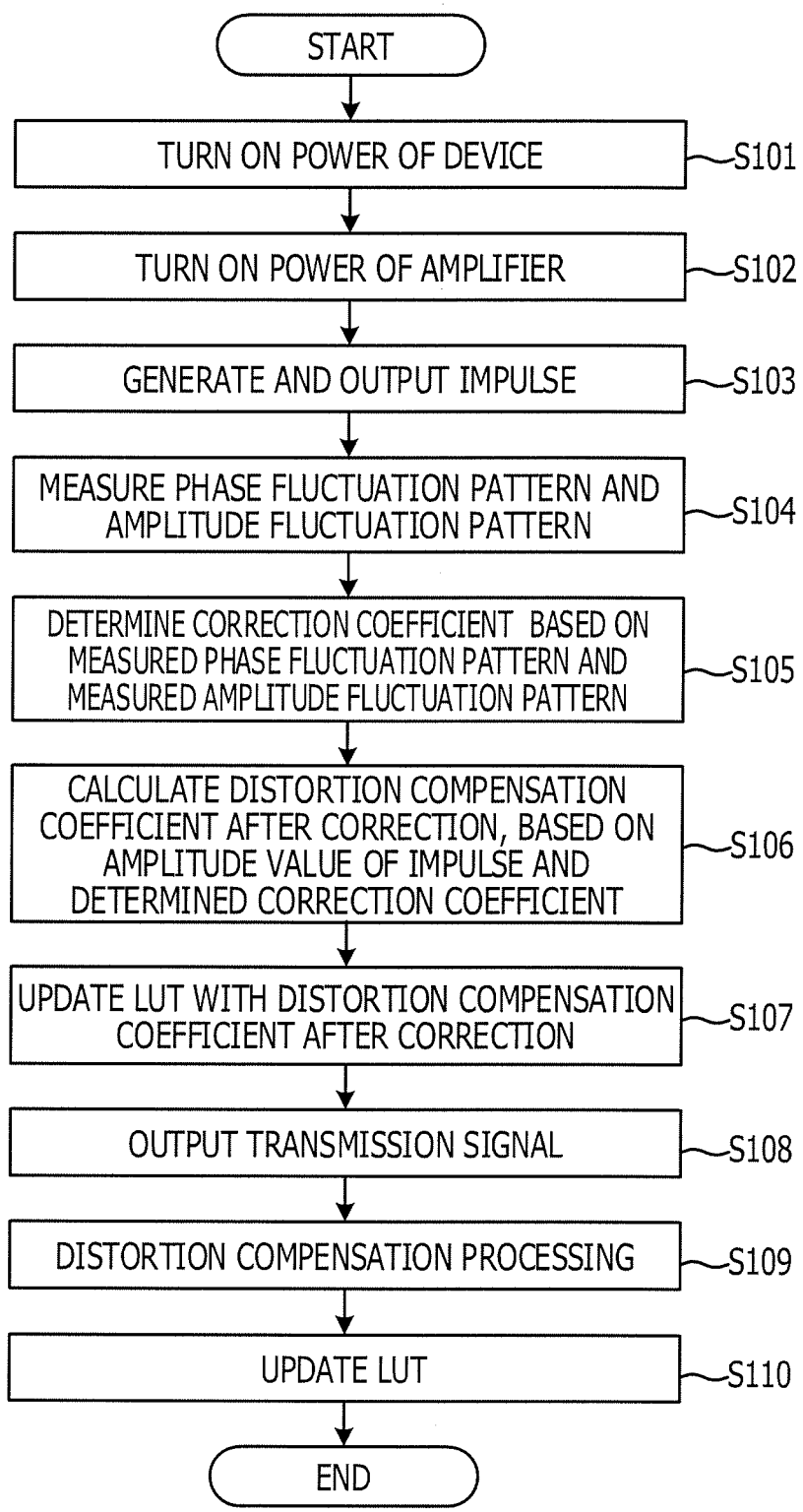
FIG. 7 is a flow chart illustrating an exemplary processing operation of a wireless device according to Embodiment 1.

An example of the processing operation of the wireless device 10 having the above-described configuration is described below. FIG. 7 is a flow chart illustrating an exemplary processing operation of a wireless device according to Embodiment 1. FIG. 7 illustrates a flow chart when the above-described first LUT correction period is a period from a time when the power of the wireless device 10 is turned on to a time when a transmission period starts.

When the power of the wireless device 10 and the power of the amplifier 16 are turned on (Step S101, Step S102), the impulse generation unit 12 generates an impulse, and outputs the generated impulse to the DAC 13 (Step S103). As described above, the impulse is not a signal to be transmitted and has an amplitude equal to or larger than a "predetermined value". Then, after the impulse passes through a transmission system including the DAC 13, the quadrature modulator 15, and the amplifier 16, the impulse is input to the measurement unit 20 via a feedback system including the frequency converter 18 and the ADC 19.

The measurement unit 20 measures, based on a signal received from the ADC 19, an amplitude fluctuation pattern or both of the amplitude fluctuation pattern and a phase fluctuation pattern when the impulse generated in the impulse generation unit 12 is input to the amplifier 16 via the DAC 13 and the quadrature modulator 15 (Step S104).

The correction unit 21 determines a correction coefficient α based on the amplitude fluctuation pattern that has been measured or both of the amplitude fluctuation pattern and the phase fluctuation pattern that have been measured (Step S105). For example, the correction unit 21 specifies the correction coefficient α corresponding to the amplitude fluctuation pattern that has been measured or both of the amplitude fluctuation pattern and the phase fluctuation pattern that have been measured from the correction coefficient correspondence table of the correction coefficient storage unit 22.

Then, the correction unit 21 calculates a distortion compensation coefficient after correction, based on the amplitude value (that is, the above-described "predetermined value") of the impulse and the determined correction coefficient α (Step S106). The correction unit 21 reads out, for example, a distortion compensation coefficient associated with an address corresponding to the "predetermined value" received from the impulse generation unit 12 in the distortion compensation coefficient table (that is, LUT), and corrects the read-out distortion compensation coefficient, based on the read-out correction coefficient α. For example, the correction unit 21 multiplies the read-out distortion compensation coefficient by the read-out correction coefficient α, thereby calculating the distortion compensation coefficient after correction.

Then, the correction unit 21 updates (corrects) the distortion compensation coefficient table (that is, LUT) with the calculated distortion compensation coefficient after correction (Step S107).

The processing period of Steps S103 to S107 described above corresponds to the above-described first LUT correction period.

Here, processing performed in the first LUT correction period is described using mathematical expressions.

When an impulse feedback signal has an I component and a Q component, an amplitude and a phase when t=t0 illustrated in FIG. 4 and FIG. 5 hold are expressed as follows.

Amplitude: $A(t0)(=\text{Gain})=\sqrt{(I(t0)^2+Q(t0)^2)}$

Phase: $\Phi(t0)(=\text{Phase})=\tan^{-1}(Q(t0)/I(t0))$

In this case, assuming that the respective reference values (that is, values before fluctuation) of the phase and the amplitude are A(0) and Φ(0), change amounts Δgain(t0) and Δphase (t0) of the amplitude and the phase after t0 are expressed as follows.

$\Delta\text{gain}(t0)=A(0)-\sqrt{(I(t0)^2+Q(t0)^2)}$ $\Delta\text{phase}(t0)=\Phi(0)-\tan^{-1}(Q(t0)/I(t0))$ Assuming that LUT with which a desired distortion compensation characteristic is achieved in the above-described Δgain(t0) and Δphase(t0) is LUT(t0), the relationship between LUT(t0) and LUT(0), which is a LUT initial value, is expressed as follows.

$\text{LUT}(t0)=\alpha(t0)\times\text{LUT}(0)$

α(t0) is determined to be one-to-one correspondence for each pair of Δgain(t0) and Δphase(t0) by performing measurement in advance. Examining the relationship between Δgain(t) and Δphase(t) and α(t) in advance enables production of LUT(t) corresponding to an Idq drift characteristic. That is, distortion compensation in accordance with an Idq drift state is enabled to be performed. In this case, conditions may not perfectly match, but approximated α(t) may be used.

Returning to the description of FIG. 7, after the first LUT correction period, a "transmission period" starts.

When the transmission period starts, a transmission signal generation unit (not illustrated) outputs a generated transmission signal (Step S108).

Then, the multiplier 11 executes distortion compensation processing on the transmission signal (Step S109). A part of the transmission signal on which distortion compensation processing has been executed passes through the above-described transmission system and then is transmitted via an antenna, and the other part thereof is input to the coefficient calculation unit 29 via the above-described feedback system.

Then, the coefficient calculation unit 29 calculates the distortion compensation coefficient after correction and outputs the distortion compensation coefficient after correction to the write unit 33.

Then, the write unit 33 updates (corrects) LUT with the distortion compensation coefficient after correction, which has been calculated by the coefficient calculation unit 29 (Step S110).

As described above, according to this embodiment, in the wireless device 10, the impulse generation unit 12 generates an impulse that is not intended to be transmitted and has an amplitude equal to or larger than a predetermined value. The measurement unit 20 measures an amplitude fluctuation pattern or both of the amplitude fluctuation pattern and a phase fluctuation pattern when the impulse is input to the amplifier 16. The correction unit 21 corrects LUT, based on the amplitude fluctuation pattern that has been measured or both of the amplitude fluctuation pattern and the phase fluctuation pattern that have been measured.

The configuration of the wireless device 10 enables correction of a distortion compensation coefficient corresponding to an amplitude (that is, an amplitude value equal to or larger than a predetermined value) with a low appearance frequency in a transmission signal by using an impulse that is not intended to be transmitted and has an amplitude equal to or larger than a predetermined value. Thus, the distortion compensation coefficient corresponding to an amplitude equal to or larger than a predetermined value is promptly caused to approximate an appropriate value. In addition, LUT is corrected based on an amplitude fluctuation pattern and a phase fluctuation pattern in a situation where an Idq drift is noticeable, and therefore, the distortion compensation coefficient is caused to approximate an appropriate value even more promptly. The Idq drift characteristic differs among individual devices due to device production variations and the like, and furthermore, the Idq drift characteristic varies in accordance with ambient temperature, an immediately preceding input signal amplitude value, and the like, any time, but LUT correction in which fluctuation in Idq drift characteristic has been dealt with is performed by performing correction using the above-described configuration. That is, accuracy in correction of the distortion coefficient is increased.

The wireless device 10 includes a filter (not illustrated) that removes frequency components of a frequency other than a desired frequency from the transmission signal amplified by the amplifier 16. The impulse generation unit 12 generates an impulse by using a frequency other than the desired frequency. Thus, the impulse is not transmitted via an antenna.

Embodiment 2

In Embodiment 1, it is assumed that the first LUT correction period does not overlap with a transmission period. In Embodiment 2, it is assumed that the first LUT correction period overlaps with a transmission period. Specifically, in Embodiment 2, in the first LUT correction period, an impulse is generated using a frequency that is not used for communication.

Figure 8:
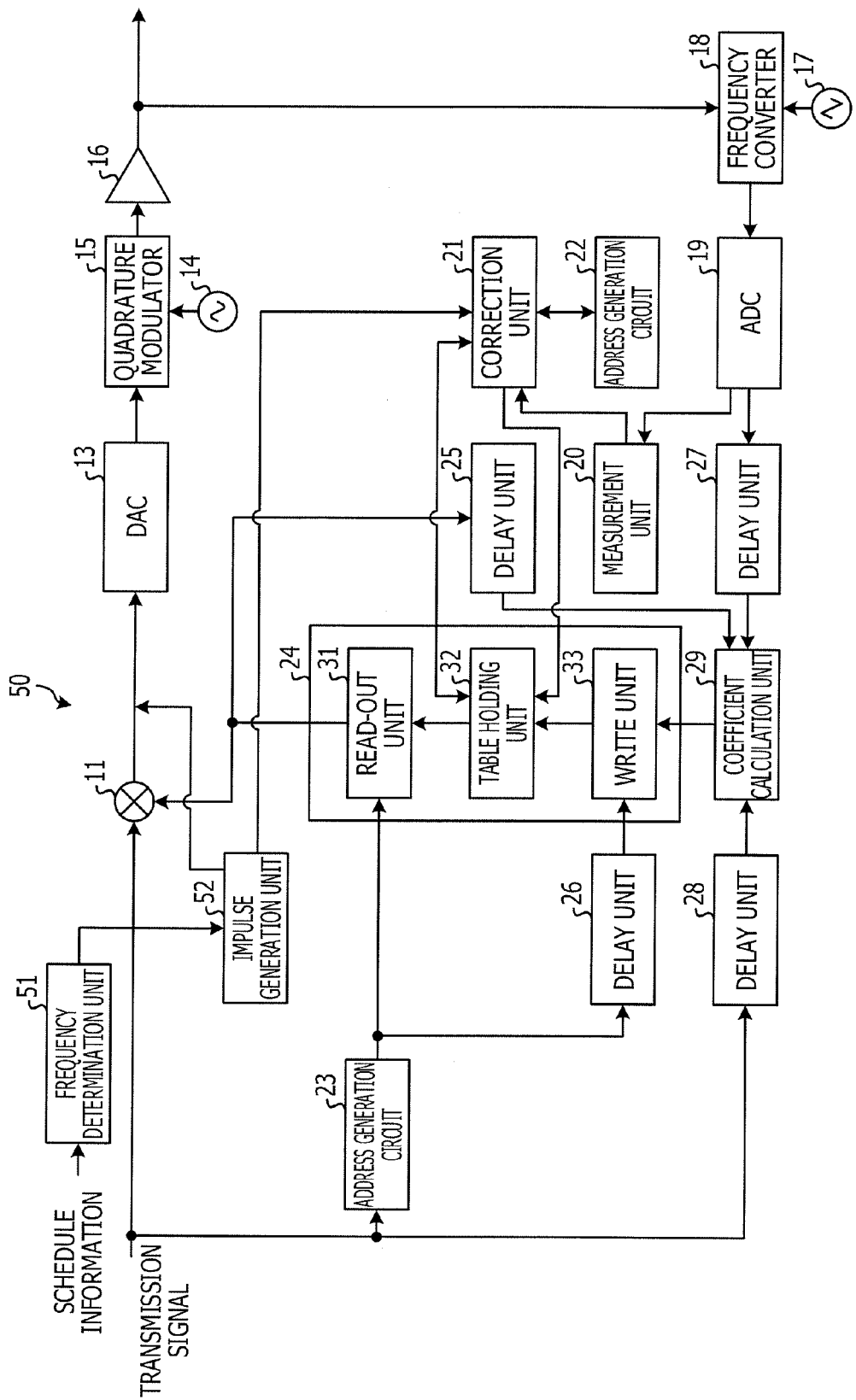
FIG. 8 is a block diagram illustrating an exemplary wireless device according to Embodiment 2.

FIG. 8 is a block diagram illustrating an exemplary wireless device according to Embodiment 2. In FIG. 8, a wireless device 50 includes a frequency determination unit 51 and an impulse generation unit 52.

The frequency determination unit 51 receives schedule information from a scheduler (not illustrated), and specifies, based on the schedule information, a frequency (which may be hereinafter referred to as a "non-use frequency") that is not used for communication at the time of generation of an impulse. Then, the frequency determination unit 51 determines all or some of specified non-use frequencies to be frequencies (which may be hereinafter referred to as "impulse generation frequencies") that are used for generating an impulse.

The impulse generation unit 52 generates an impulse by using an impulse generation frequency determined by the frequency determination unit 51, and outputs the generated impulse to the DAC 13.

As described above, according to this embodiment, in the wireless device 50, the impulse generation unit 52 generates an impulse by using a frequency that is not used for communication at the time of the generation of the impulse.

With the above-described configuration of the wireless device 50, even when a transmission period and the first LUT correction period overlap, LUT correction using an impulse is executed without interrupting transmission.

Other Embodiments

[1] In Embodiment 1 and Embodiment 2, a temperature in each of the environments in which the wireless device 10 and the wireless device 50 are placed is not particularly considered, but may be taken into consideration. For example, a temperature sensor is provided in each of the wireless device 10 and the wireless device 50. Then, a correction coefficient correspondence table corresponding to each environment temperature is held in the correction coefficient storage unit 22. Then, the correction unit 21 determines a correction coefficient α using the correction coefficient correspondence table corresponding to an environment temperature measured by the temperature sensor.

[2] Each constituent element of each unit illustrated in Embodiment 1 and Embodiment 2 may not be physically configured as illustrated in the drawings. That is, specific embodiments of disintegration and integration of each unit are not limited to those illustrated in the drawings, and all or some of the units may be disintegrated/integrated functionally or physically in an arbitrary unit in accordance with various loads, use conditions, and the like.

Furthermore, all or some of the processing functions performed by each unit may be executed by a central processing unit (CPU) or a micro computer, such as a micro processing unit (MPU), a micro controller unit (MCU), or the like. Also, all or some of the processing functions may be executed on a program analyzed and executed by a CPU (or a micro computer, such as an MPU, MCU, or the like) or a hardware by wired logic.

Each of the wireless devices according to Embodiment 1 and Embodiment 2 may be realized by, for example, the following hardware configuration.

Figure 9:
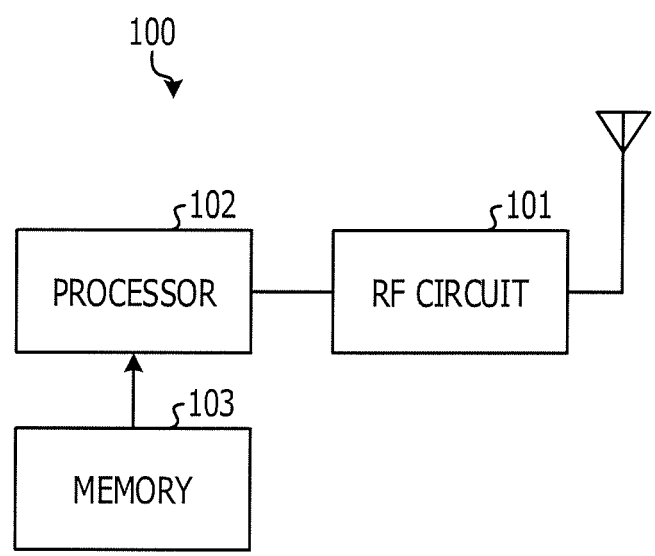
FIG. 9 is a diagram illustrating an exemplary hardware configuration of a wireless device.

FIG. 9 is a diagram illustrating an exemplary hardware configuration of a wireless device. As illustrated in FIG. 9, the wireless device 100 includes a radio frequency (RF) circuit 101, a processor 102, and a memory 103.

Examples of the processor 102 include a CPU, a digital signal processor (DSP), a field programmable gate array (FPGA), and the like. Examples of the memory 103 include a random access memory (RAM), such as a synchronous dynamic random access memory (SDRAM) or the like, a read only memory (ROM), a flash memory, and the like.

The processing functions performed by each of the wireless device 10 according to Embodiment 1 and the wireless device 50 according to Embodiment 2 may be realized by causing a processor provided in a call device to execute programs stored in various memories, such as a non-volatile memory medium, and the like. A program corresponding to the processing executed by each of the multiplier 11, the impulse generation units 12 and 52, the DAC 13, the measurement unit 20, the correction unit 21, the address generation circuit 23, the LUT 24, the delay units 25, 26, 27, and 28, the coefficient calculation unit 29, and the frequency determination unit 51 may be stored in the memory 103, and may be executed by the processor 102. The local oscillators 14 and 17, the quadrature modulator 15, the amplifier 16, the frequency converter 18, and the ADC 19 are realized by the RF circuit 101. The table holding unit 32 and the correction coefficient storage unit 22 are realized by the memory 103.

[3] In this case, the wireless device 100 has been described as a single device, but an embodiment is not limited thereto. For example, the wireless device 100 may be configured by two separate devices, that is, a wireless device and a wireless control device. That is, the wireless device 100 may be realized as a wireless access system including a wireless device and a wireless control device. In this case, for example, the RF circuit 101 is provided in the wireless device and the processor 102 and the memory 103 are provided in the wireless control device.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A distortion compensation apparatus comprising:
an amplifier configured to amplify an input signal including a transmission signal and an impulse signal, the transmission signal being converted to a radio frequency signal for transmission, the impulse signal being not converted to a radio signal for transmission, the impulse signal being generated so as to have a predetermined amplitude;
a memory configured to store a plurality of distortion compensation coefficients for compensating distortion to the input signal, each of the plurality of distortion compensation coefficients being associated with an amplitude of the input signal; and
a processor configured to
select a distortion compensation coefficient from the plurality of distortion compensation coefficients based on an address corresponding to the predetermined amplitude of the impulse signal included in the input signal, the address corresponding to the predetermined amplitude of the impulse signal being generated when the impulse signal is generated, and
update the selected distortion compensation coefficient based on the amplified impulse signal include in the amplified input signal.

2. The distortion compensation apparatus according to claim 1, wherein
the impulse signal has the predetermined amplitude that is more than a given value.

3. The distortion compensation apparatus according to claim 2, wherein
the given value is more than an average amplitude of the impulse signal.

4. The distortion compensation apparatus according to claim 1, wherein
the processor is further configured to
identify a correction coefficient based on the amplified impulse signal.

5. The distortion compensation apparatus according to claim 4, wherein
the processor is configured to identify the correction coefficient based on a change in an amplitude of the amplified impulse signal.

6. The distortion compensation apparatus according to claim 5, wherein
the processor is configured to identify the correction coefficient further based on a change in a phase of the amplified impulse signal.

7. The distortion compensation apparatus according to claim 4, wherein
the processor is configured to
select a second distortion compensation coefficient from the plurality of distortion compensation coefficients based on an amplitude of the transmission signal included in the input signal, and
update the second selected distortion compensation coefficient based on the amplified transmission signal include in the amplified input signal without using the correction coefficient.

8. The distortion compensation apparatus according to claim 1, further comprising:
an impulse generation circuit configured to generate the impulse signal.

9. The distortion compensation apparatus according to claim 8, further comprising:
a filter configured to remove a signal having a given frequency from the amplified input signal,
wherein the impulse generation circuit is configured to generate the impulse signal having the given frequency.

10. The distortion compensation apparatus according to claim 8, wherein
the impulse generation circuit is configured to generate the impulse signal having a frequency that is not selected for the transmission signal.

11. The distortion compensation apparatus according to claim 1, wherein
the impulse signal and the transmission signal are separated in time axis.

12. The distortion compensation apparatus according to claim 1, wherein
the impulse signal and the transmission signal are separated in frequency axis.

13. The distortion compensation apparatus according to claim 1, wherein
the amplifier is a gallium nitride (GaN) device.

14. A wireless communication system comprising:
a wireless control apparatus configured to generate a transmission signal that is converted to a radio frequency signal for transmission; and
a wireless transmission apparatus including
an amplifier configured to amplify an input signal including the transmission signal and an impulse signal, the impulse signal being not converted to a radio signal for transmission, the impulse signal being generated so as to have a predetermined amplitude,
a memory configured to store a plurality of distortion compensation coefficients for compensating distortion to the input signal, each of the plurality of distortion compensation coefficients being associated with an amplitude of the input signal, and
a processor configured to
select a distortion compensation coefficient from the plurality of distortion compensation coefficients based on an address corresponding to the predetermined amplitude of the impulse signal included in the input signal, the address corresponding to the predetermined amplitude of the impulse signal being generated when the impulse signal is generated, and
update the selected distortion compensation coefficient based on the amplified impulse signal include in the amplified input signal.

15. A distortion compensation method comprising:
amplifying an input signal including a transmission signal and an impulse signal, the transmission signal being converted to a radio frequency signal for transmission, the impulse signal being not converted to a radio signal for transmission, the impulse signal being generated so as to have a predetermined amplitude;
storing a plurality of distortion compensation coefficients for compensating distortion to the input signal, each of the plurality of distortion compensation coefficients being associated with an amplitude of the input signal;
selecting a distortion compensation coefficient from the plurality of distortion compensation coefficients based on an address corresponding to the predetermined amplitude of the impulse signal included in the input signal, the address corresponding to the predetermined amplitude of the impulse signal being generated when the impulse signal is generated; and
updating the selected distortion compensation coefficient based on the amplified impulse signal include in the amplified input signal.

* * * * *